(12) United States Patent
Kim et al.

(10) Patent No.: US 12,262,569 B2
(45) Date of Patent: Mar. 25, 2025

(54) PIXEL FOR MICRO-DISPLAY HAVING VERTICALLY STACKED SUB-PIXELS

(71) Applicant: SUNDIODE KOREA, Seoul (KR)

(72) Inventors: James Chinmo Kim, Mountain View, CA (US); Sungsoo Yi, Sunnyvale, CA (US)

(73) Assignee: SUNDIODE KOREA (KR)

(*) Notice: Subject to any disclaimer, the term of this patent is extended or adjusted under 35 U.S.C. 154(b) by 466 days.

(21) Appl. No.: 17/722,271

(22) Filed: Apr. 15, 2022

(65) Prior Publication Data

US 2023/0238420 A1    Jul. 27, 2023

(30) Foreign Application Priority Data

Jan. 25, 2022    (KR) .................. 10-2022-0010597

(51) Int. Cl.
| | |
|---|---|
| H10H 29/14 | (2025.01) |
| H10H 20/811 | (2025.01) |
| H10H 20/816 | (2025.01) |
| H10H 20/824 | (2025.01) |
| H10H 20/857 | (2025.01) |

(52) U.S. Cl.
CPC ........ *H10H 29/142* (2025.01); *H10H 20/811* (2025.01); *H10H 20/8162* (2025.01); *H10H 20/824* (2025.01); *H10H 20/857* (2025.01)

(58) Field of Classification Search
CPC ..... H01L 27/156; H01L 33/04; H01L 33/145; H01L 33/30; H01L 33/62; H01L 27/15; H01L 25/0753; H01L 33/06; H01L 33/382; H01L 25/0657; H01L 25/167; H01L 33/005; H01L 33/08; H01L 2224/0344

See application file for complete search history.

(56) References Cited

U.S. PATENT DOCUMENTS

| | | | | |
|---|---|---|---|---|
| 11,404,604 | B2* | 8/2022 | Kim | H01L 33/04 |
| 11,437,544 | B2* | 9/2022 | Kim | H01L 33/325 |
| 2006/0255343 | A1* | 11/2006 | Ogihara | B41J 2/45 |
| | | | | 257/E25.02 |
| 2009/0078955 | A1* | 3/2009 | Fan | H01L 27/15 |
| | | | | 438/46 |
| 2009/0272989 | A1* | 11/2009 | Shum | H01L 33/08 |
| | | | | 257/89 |
| 2013/0056785 | A1* | 3/2013 | Hwang | H01L 27/15 |
| | | | | 257/E33.062 |
| 2013/0277692 | A1* | 10/2013 | Chang | H01L 25/0756 |
| | | | | 257/89 |
| 2015/0325555 | A1* | 11/2015 | Hashimoto | H01L 33/42 |
| | | | | 257/89 |
| 2019/0189596 | A1* | 6/2019 | Chae | H01L 33/50 |
| 2019/0206927 | A1* | 7/2019 | Lee | H01L 25/0753 |
| 2020/0126963 | A1* | 4/2020 | Lee | H01L 25/0655 |
| 2020/0144233 | A1* | 5/2020 | Lee | H01L 33/08 |
| 2020/0144326 | A1* | 5/2020 | Lee | H01L 33/505 |

(Continued)

FOREIGN PATENT DOCUMENTS

KR    101102168 B1    1/2012

*Primary Examiner* — Bitew A Dinke
(74) *Attorney, Agent, or Firm* — Renaissance IP Law Group LLP

(57) ABSTRACT

A unit pixel of a microdisplay is disclosed. In the unit pixel, sub-pixels that form blue light, green light, and red light are vertically stacked on a growth substrate. Accordingly, the unit pixel area may be reduced, and pixel transfer processing is facilitated.

13 Claims, 3 Drawing Sheets

(56) References Cited

U.S. PATENT DOCUMENTS

| | | | |
|---|---|---|---|
| 2020/0152691 A1* | 5/2020 | Lee | H01L 27/15 |
| 2020/0287080 A1* | 9/2020 | Kim | H01L 33/0016 |
| 2020/0402964 A1* | 12/2020 | Kim | H01L 25/0756 |
| 2021/0296528 A1* | 9/2021 | Fujiwara | H01L 33/325 |
| 2022/0165718 A1* | 5/2022 | Chae | H01L 33/50 |
| 2022/0328719 A1* | 10/2022 | Jang | H01L 27/153 |
| 2023/0051845 A1* | 2/2023 | Zollner | H01L 27/15 |
| 2023/0077969 A1* | 3/2023 | Li | H01L 33/62 |
| | | | 257/89 |
| 2023/0111380 A1* | 4/2023 | Kim | H01L 33/007 |
| | | | 257/13 |
| 2023/0238481 A1* | 7/2023 | Kim | H01L 27/153 |
| | | | 257/79 |

* cited by examiner

PIXEL FOR MICRO-DISPLAY HAVING VERTICALLY STACKED SUB-PIXELS

CROSS-REFERENCE TO RELATED APPLICATION

This application claims priority to Korean Patent Application No. 2022-0010597 filed on Jan. 25, 2022 in the Korean Intellectual Property Office (KIPO), the entire contents of which are hereby incorporated by reference.

BACKGROUND

1. Technical Field

Example embodiments of the present disclosure relate in general to a structure of a pixel of a microdisplay, and more particularly, to a structure in which sub-pixels are vertically stacked in one pixel.

2. Description of Related Art

Microdisplays are next generation display devices that are being actively developed by many display manufacturers. In the microdisplay, each pixel is composed of sub-pixels, and each of the sub-pixels forms red, green, or blue light. The sub-pixel that forms light of an intrinsic color has a structure of a light-emitting diode (LED). That is, there is an advantage in that an illuminant has an intrinsic, self-emitting color, and thus a backlight is not required when compared to a liquid-crystal display (LCD). In addition, the LED constituting the sub-pixel is made of an inorganic material and thus has very high reliability and stability. In addition, it is possible to obtain very clear images with less power consumption as compared with an organic light-emitting diode (OLED), and because it is possible to manufacture displays of various shapes by fabricating LEDs using a conventional metal-organic chemical vapor deposition (MOCVD) process, it is known to be very advantageous for reducing the thickness of a display.

Further, in order for one pixel to realize full color in a microdisplay, sub-pixels need to be spaced apart from each other on a substrate, and at least three sub-pixels need to be disposed in the same plane.

The arrangement of three sub-pixels in the same plane to form one unit pixel is a conventional method and is a technique being used in LCDs, OLEDs, and the like. In addition, while this arrangement is also expected to be applied to a microdisplay, there are several problems in applying the conventional pixel formation method to the microdisplay, which are very large obstacles for implementing the microdisplay.

First, the conventional pixel formation technique requires laborious sub-pixel transfer processes. A compound semiconductor formed on a growth substrate is diced into chips through a singulation process, and the individual chips need to be transferred onto a display substrate. Thus, a pick-and-place process is essential to manufacture the microdisplay. These processes are collectively referred to as a transfer process. In order to form a unit pixel with the conventional pixel formation technique, a transfer process needs to be performed at least three times per unit pixel. That is, a red LED, a green LED, and a blue LED need to be individually transferred onto the display substrate. Since one sub-pixel needs to have a size of about 10 um or less, it is not easy to pick and place such a small-sized LED to a specific position on the display substrate, and because the process has to be repeated at least 3 times, it is also very burdensome.

Second, there is the problem of a black matrix. The black matrix is also used in a conventional LCD and the like and is used to prevent color interference between sub-pixels, each of which realizes a particular color. The black matrix also needs to be used in sub-pixels of a microdisplay. In particular, the sub-pixel is composed of an LED, and an active layer or a multi-quantum well structure for forming light emits very high intensity light laterally due to crystallographic characteristics. Accordingly, when the black matrix is not used, a desired color may not be realized due to very severe light interference. Accordingly, it is essential to introduce the black matrix to prevent light interference between sub-pixels. However, as described above, in the LED sub-pixel, high intensity light formed in the active layer is emitted laterally due to the crystallographic characteristics. In the case of a blue LED, light tends to be emitted in a direction perpendicular to the c-axis direction. This phenomenon is due to inherent characteristics of an LED. In addition, the intensity of such lateral-emitted light is very high as compared with other displays such as an LCD or an OLED. Thus, in order to avoid light interference between adjacent sub-pixels, a thick black matrix needs to be formed, and the thick matrix may be achieved by increasing separation between the sub-pixels. When the separation distance between the sub-pixels increases, the unit pixel size increases, and thus the increased unit pixel size causes a reduction in the resolution of a display.

Third, in the case of a method of forming a single pixel by arranging sub-pixels in the same plane, there is a disadvantage in that one or more pixels of a display backplane must be used per single pixel of a display. That is, at least three pixels of the display backplane must be used per single pixel of the display, and typically four pixels are used.

Accordingly, a pixel structure capable of realizing a high resolution by easily implementing a small-sized pixel without having to arrange sub-pixels in the same plane is highly necessary.

SUMMARY

Example embodiments of the present inventive concept provide a structure of a pixel of a microdisplay having vertically stacked sub-pixels.

In some example embodiments, a unit pixel of a microdisplay includes a first sub-pixel formed on a growth substrate, a second sub-pixel formed on the first sub-pixel, a common electrode layer formed between the first sub-pixel and the second sub-pixel, a third sub-pixel formed on the second sub-pixel, and a contact layer formed between the growth substrate and the first sub-pixel, and independently connected to each of the first sub-pixel, the second sub-pixel, and the third sub-pixel.

The contact layer may include a first n-type contact layer formed on the growth substrate and connected to the third sub-pixel, a second n-type contact layer formed on the first n-type contact layer and connected to the second sub-pixel, and a third n-type contact layer formed on the second n-type contact layer and connected to the first sub-pixel.

The unit pixel of a microdisplay may include a first current blocking layer formed between the first n-type contact layer and the second n-type contact layer, and a second current blocking layer formed between the second n-type contact layer and the third n-type contact layer.

The first current blocking layer and the second current blocking layer may each be a p-type semiconductor or an insulating material.

The unit pixel of a microdisplay may further include a first tunnel junction layer formed between the common electrode layer and the first sub-pixel, and a second tunnel junction layer formed between the common electrode layer and the second sub-pixel.

The first sub-pixel may include a first n-type semiconductor layer, a first active layer, and a first p-type semiconductor layer which are sequentially stacked, the second sub-pixel may include a second p-type semiconductor layer, a second active layer, and a second n-type semiconductor layer which are sequentially stacked, and the third sub-pixel may include a third n-type semiconductor layer, a third active layer, and a third p-type semiconductor layer which are sequentially stacked.

The unit pixel of a microdisplay may further include a third current blocking layer formed between the second sub-pixel and the third sub-pixel.

The third current blocking layer may be a p-type semiconductor or an insulating material.

The unit pixel of a microdisplay may include a first interconnect layer configured to electrically connect the second n-type semiconductor layer and the second n-type contact layer, a second interconnect layer configured to electrically connect the third n-type semiconductor layer and the first n-type contact layer, and a common anode formed on an exposed surface of the common electrode layer and covering the third p-type semiconductor layer.

The first interconnect layer may be formed on an exposed portion of each of the second n-type semiconductor layer and the second n-type contact layer, and the second interconnect layer may be formed on an exposed portion of each of the third n-type semiconductor layer and the first n-type contact layer to extend from the third n-type semiconductor layer to the first n-type contact layer.

The first sub-pixel may include a first n-type semiconductor layer, a first active layer, and a first p-type semiconductor layer which are sequentially stacked, the second sub-pixel may include a second p-type semiconductor layer, a second active layer, and a second n-type semiconductor layer which are sequentially stacked, and the third sub-pixel may include a third p-type semiconductor layer, a third active layer, and a third n-type semiconductor layer which are sequentially stacked.

The unit pixel of a microdisplay may further include a bonding layer formed between the second sub-pixel and the third sub-pixel.

The unit pixel of a microdisplay may include a first interconnect layer configured to electrically connect the second n-type semiconductor layer and the second n-type contact layer, a second interconnect layer configured to electrically connect the third n-type semiconductor layer and the first n-type contact layer, and a common anode formed on the common electrode layer and the third p-type semiconductor layer and covering the third n-type semiconductor layer, wherein the common anode is formed to be insulated from the third n-type semiconductor layer.

The first interconnect layer may be formed on an exposed portion of each of the second n-type semiconductor layer and the second n-type contact layer, and the second interconnect layer may be formed on an exposed portion of each of the third n-type semiconductor layer and the first n-type contact layer to extend from the third n-type semiconductor layer to the first n-type contact layer.

The third active layer may include AlInGaP.

BRIEF DESCRIPTION OF DRAWINGS

Example embodiments of the present inventive concept will become more apparent by describing in detail example embodiments of the present inventive concept with reference to the accompanying drawings, in which.

DESCRIPTION OF EXAMPLE EMBODIMENTS

Figure 1:
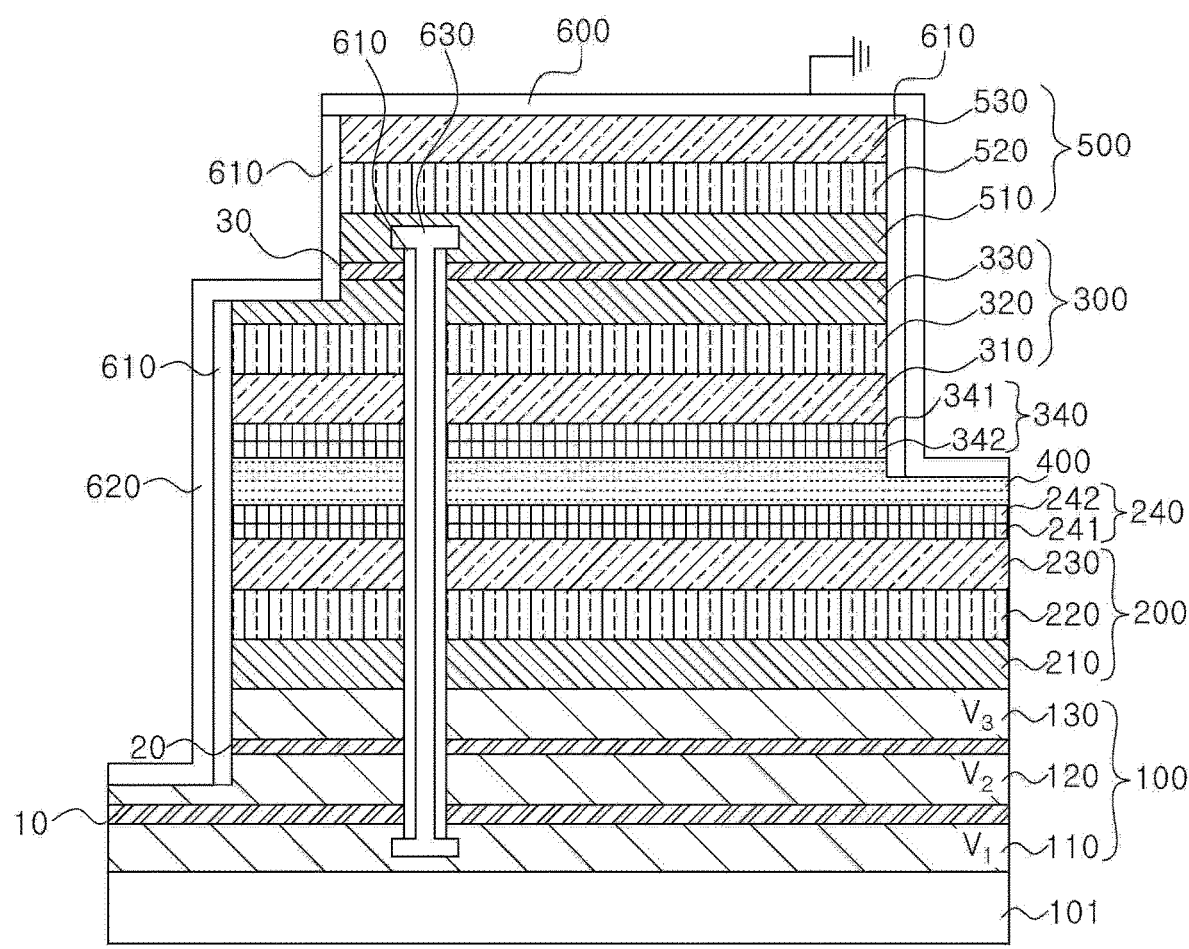
FIG. 1 is a schematic cross-sectional view of a pixel of a microdisplay according to a first example embodiment of the present inventive concept.

Hereinafter, example embodiments of the present inventive concept will be described in detail with reference to the accompanying drawings.

The present inventive concept is susceptible to various modifications and changes, particular example embodiments of which will be exemplified in the drawings and described in detail. However, the present inventive concept is not intended to be limited to the particular form disclosed, but rather, the present inventive concept includes all modifications, equivalents, and substitutions that are combined with the spirit of the present inventive concept as defined by the claims.

It will be understood that when an element such as a layer, region, or substrate is referred to as being present "on" another constituent element, the element may be disposed directly on another element or still another element may be present therebetween.

It will be understood that although the terms first, second, and the like may be used to describe various elements, components, regions, layers and/or sections, these elements, components, regions, layers, and/or sections should not be limited by these terms.

First Example Embodiment

FIG. 1 is a schematic cross-sectional view of a pixel of a microdisplay according to a first example embodiment of the present inventive concept.

Referring to FIG. 1, the pixel of the microdisplay according to the first example embodiment of the present inventive concept includes a contact layer 100, a first sub-pixel 200, a second sub-pixel 300, a common electrode layer 400, and a third sub-pixel 500.

The contact layer 100 may be formed on a growth substrate 101. As the growth substrate 101, any substrate used for light-emitting devices may be applied, and specifically, the growth substrate 101 may be, for example, a sapphire ($Al_2O_3$) substrate, a SiC substrate, a GaN substrate, a GaP substrate, a GaAs substrate, an InP substrate, or a ZnO substrate, but the present inventive concept is not limited thereto.

The contact layer 100 may be formed on the growth substrate 101, and a pulse of voltage for operating a pixel of the microdisplay may be externally applied to the contact layer 100.

Further, the contact layer 100 may include a first n-type contact layer 110, a second n-type contact layer 120, and a third n-type contact layer 130. The first n-type contact layer 110 may be formed on the growth substrate 101, and the second n-type contact layer 120 and the third n-type contact layer 130 may be sequentially formed on the first n-type contact layer 110.

As an example, the first n-type contact layer 110 may be connected to the third sub-pixel 500, and the second n-type contact layer 120 may be connected to the second sub-pixel 300. In addition, the third n-type contact layer 130 may be connected to the first sub-pixel 200. For example, the third sub-pixel 500 may form light by a pulse of voltage applied to the first n-type contact layer 110, and the second sub-pixel 300 may form light by a pulse of voltage applied to the second n-type contact layer 120. In addition, the first sub-pixel 200 may form light by a pulse of voltage applied to the third n-type contact layer 130.

That is, the first n-type contact layer 110, the second n-type contact layer 120, and the third n-type contact layer 130 may serve as individual cathodes of the first sub-pixel 200, the second sub-pixel 300, and the third sub-pixel 500. For example, the first sub-pixel 200, the second sub-pixel 300, and the third sub-pixel 500 may have commonly connected anodes through a common anode 600 to be described below, and may be forward biased from the common anode 600 to the first n-type contact layer 110, the second n-type contact layer 120, and the third n-type contact layer 130 which are independent.

The first n-type contact layer 110, the second n-type contact layer 120, and the third n-type contact layer 130 may include a GaN material, and Si may be used as a dopant. In addition, each of the n-type contact layers 110, 120, and 130 may be formed to have a thickness of 1 to 2 µm.

In the present example embodiment, the configuration in which the first n-type contact layer 110, the second n-type contact layer 120, and the third n-type contact layer 130 are respectively connected to the third sub-pixel 500, the second sub-pixel 300, and the first sub-pixel 200 is illustrated, but any configuration is possible as long as it is a configuration in which the contact layer 100 and each of the sub-pixels are independently connected to each other.

Further, a first current blocking layer 10 may be formed between the first n-type contact layer 110 and the second n-type contact layer 120, and a second current blocking layer 20 may be formed between the second n-type contact layer 120 and the third n-type contact layer 130.

The first current blocking layer 10 and the second current blocking layer 20 are formed between the contact layers 110, 120, and 130 to block a leakage current between the contact layers 110, 120, and 130. In order for the current flowing between the contact layers 110, 120, and 130 to be blocked, each of the first current blocking layer 10 and the second current blocking layer 20 needs to have a high resistance or be reverse-biased with respect to the contact layers 110, 120, and 130. For example, since the first current blocking layer 10 is in contact with the first n-type contact layer 110 and the second n-type contact layer 120, and the second current blocking layer 20 is in contact with the second n-type contact layer 120 and the third n-type contact layer 130, the first current blocking layer 10 and the second current blocking layer 20 may be set as p-type semiconductor layers to form reverse-biased junctions vertically. In addition, the first current blocking layer 10 and the second current blocking layer 20 may be formed of non-conducting GaN doped with a transition metal, or $SiO_2$ which is an insulating material.

When the first current blocking layer 10 and the second current blocking layer 20 are p-type semiconductor layers, the first current blocking layer 10 and the second current blocking layer 20 may be made of Mg-doped GaN or Mg-doped AlGaN, and when the first current blocking layer 10 and the second current blocking layer 20 are insulating layers, Fe-doped GaN or $SiO_2$ may be used for the first current blocking layer 10 and the second current blocking layer 20. When Fe is used as a dopant, Fe atoms act as deep level acceptors and may result in a very high value of resistance.

For example, in Fe-doped GaN, sheet resistance has a value of 200 k$\Omega$/□ at an Fe concentration of $1.7\times10^{18}$ cm$^{-3}$, and sheet resistance has a value of $7\times10^9$ k$\Omega$/□ at an Fe concentration of $1.3\times10^{19}$ cm$^{-3}$. Accordingly, the doping concentration of Fe in the first current blocking layer 10 and the second current blocking layer 20 is preferably $1\times10^{19}$ cm$^{-3}$ or more. A thickness of each of the first current blocking layer 10 and the second current blocking layer 20 needs to be 100 nm or more and 1 µm or less. When the thickness of each of the first current blocking layer 10 and the second current blocking layer 20 is less than 100 nm, a sufficient resistance value may not be obtained, and when the thickness of each of the first current blocking layer 10 and the second current blocking layer 20 exceeds 1 µm, productivity may be reduced due to excessive layer growth time.

Further, in addition to Fe, a transition metal such as Mn, Co, Ni, or Cu may be used as a dopant acting as a deep level acceptor.

Further, the first current blocking layer 10 and the second current blocking layer 20 may each have p-type conductivity. That is, the first current blocking layer 10 may be in contact with the first n-type contact layer 110 and the second n-type contact layer 120, and the second current blocking layer 20 may be in contact with the second n-type contact layer 120 and the third n-type contact layer 130. Accordingly, a current flowing from the respective contact layers 110, 120, and 130 toward the first current blocking layer 10 and the second current blocking layer 20 may be blocked due to the reverse bias.

The sub-pixels 200, 300, and 500 may be formed on the contact layer 100. That is, the first sub-pixel 200, the second sub-pixel 300, and the third sub-pixel 500 may be formed on the contact layer 100.

Here, the second sub-pixel 300 may have a structure stacked on the first sub-pixel 200, and the third sub-pixel 500 may have a structure stacked on the second sub-pixel 300. That is, the first sub-pixel 200, the second sub-pixel 300, and the third sub-pixel 500 may have a sequentially stacked structure.

The first sub-pixel 200 forms light having a first wavelength, and the second sub-pixel 300 forms light having a second wavelength longer than the first wavelength. In addition, the third sub-pixel 500 forms light having a third wavelength longer than the second wavelength. As an example, the first sub-pixel 200 may emit blue light, the second sub-pixel 300 may emit green light, and the third sub-pixel 500 may emit red light.

The first sub-pixel 200 may be formed on the third n-type contact layer 130. In addition, the first sub-pixel 200 may include a first n-type semiconductor layer 210, a first active layer 220, and a first p-type semiconductor layer 230, and the second sub-pixel 300 may include a second p-type semiconductor layer 310, a second active layer 320, and a second n-type semiconductor layer 330.

That is, the first sub-pixel 200 may be formed in a structure in which the first n-type semiconductor layer 210, the first active layer 220, and the first p-type semiconductor layer 230 are sequentially stacked, and the second sub-pixel 300 may be formed in a structure in which the second p-type semiconductor layer 310, the second active layer 320, and the second n-type semiconductor layer 330 are sequentially stacked.

Here, the first n-type semiconductor layer 210 and the second n-type semiconductor layer 330 may be compound semiconductor layers that provide electrons to the first active layer 220 and the second active layer 320, respectively, and may be compound semiconductor layers of group III-V elements to which an n-type impurity such as Sn, Si, N, P, Ge, or Se is added. Specifically, for example, the first n-type semiconductor layer 210 and the second n-type semiconductor layer 330 may be n-type doped GaN, AlGaN, InGaN, InAlGaN, AlN, InN, AlInN, GaAs, GaAsP, or AlGaAs, but may preferably be a GaN material, and Si may be used as a dopant.

Here, the first n-type semiconductor layer 210 may be a semiconductor layer having the same material as the third n-type contact layer 130. Accordingly, any one layer of the first n-type semiconductor layer 210 and the third n-type contact layer 130 may be omitted according to the example embodiments. As an example, when the first n-type semiconductor layer 210 is omitted, the third n-type contact layer 130 may serve as the first n-type semiconductor layer 210 as well as the contact layer.

The first active layer 220 and the second active layer 320 are layers in which electrons injected from the first n-type semiconductor layer 210 and second n-type semiconductor layer 330 and holes injected from the first p-type semiconductor layer 230 and the second p-type semiconductor layer 310 respectively recombine to emit light, may emit light of various colors depending on the composition of constituent materials, and may use all typical active layer materials. Specifically, for example, the first active layer 220 and the second active layer 320 may each have a multi-quantum well (MQW) or a single quantum well structure in which $In_xAl_yGa(1-x-y)N$ ($0 \leq x < 1$, $0 \leq y < 1$, and $0 \leq x+y < 1$) layer forms a well layer and $In_aAl_bGa(1-a-b)N$ ($0 \leq a < 1$, $0 \leq b \leq 1$, and $0 \leq a+b < 1$) layer forms a barrier layer. Here, "a" and "b" are irrespective of "x" and "y," and serve to form a barrier structure. Alternatively, the first active layer 220 and the second active layer 320 may include a zinc oxide-based material such as ZnMgO or ZnCdO, and depending on the example embodiment, the first active layer 220 and the second active layer 320 may be formed of a doped compound semiconductor. However, the band gap of the well layer of the first active layer 220 needs to be larger than the band gap of the well layer of the second active layer 320, which may be implemented by controlling the fraction of In.

The first p-type semiconductor layer 230 and the second p-type semiconductor layer 310 may be compound semiconductor layers that provide holes to the first active layer 220 and the second active layer 320, respectively, and may be compound semiconductor layers of group III-V elements to which a p-type impurity such as Mg, N, P, As, Zn, Li, or Cu is added. Specifically, for example, the first p-type semiconductor layer 230 and the second p-type semiconductor layer 310 may each be p-type doped GaN, AlGaN, InGaN, InAlGaN, AlN, InN, AlInN, GaAs, GaAsP, or AlGaAs, but may preferably be a GaN material, and Mg may be used as a dopant.

Subsequently, the common electrode layer 400 may be included between the first sub-pixel 200 and the second sub-pixel 300. In addition, a first tunnel junction layer 240 may be further included between the first sub-pixel 200 and the common electrode layer 400, and a second tunnel junction layer 340 may be further included between the common electrode layer 400 and the second sub-pixel 300.

Here, the common electrode layer 400 may be an n-type semiconductor, for example, n-GaN, but the present inventive concept is not limited thereto.

The first tunnel junction layer 240 is disposed on a lower surface of the common electrode layer 400. The first tunnel junction layer 240 may have, for example, a structure in which an $n^{++}$-GaN layer 242 and a $p^{++}$-GaN layer 241 are sequentially disposed in a downward direction from the common electrode layer 400, or a structure in which the $p^{++}$-GaN layer 241 and the $n^{++}$-GaN layer 242 are sequentially stacked.

The second tunnel junction layer 340 is disposed on an upper surface of the common electrode layer 400. The second tunnel junction layer 340 may have, for example, a structure in which an $n^{++}$-GaN layer 342 and a $p^{++}$-GaN layer 341 are sequentially disposed in an upward direction from the common electrode layer 400, or a structure in which the $p^{++}$-GaN layer 341 and the $n^{++}$-GaN layer 342 are sequentially stacked.

Since the first tunnel junction layer 240 and the second tunnel junction layer 340 are respectively disposed on the lower surface and the upper surface of the common electrode layer 400 made of an n-type semiconductor such as n-GaN, and holes may be injected into the first active layer 220 and the second active layer 320 through the common electrode layer 400, a pixel in which two sub-pixels are stacked may be implemented. Furthermore, in the structure of the pixel of the microdisplay according to the present inventive concept, since the common electrode layer 400 for injecting holes may be formed of an n-type semiconductor, current spreading in the common electrode layer 400 is excellent compared with the conventional pixel structure in which a hole injection layer is formed of a p-type semiconductor, thereby improving light-emitting efficiency of a light-emitting diode (LED).

The tunnel junction layers 240 and 340 described above may not be a sequential structure of the $n^{++}$-GaN layer and the $p^{++}$-GaN layer. That is, the two tunnel junction layers may be composed of only the $p^{++}$-GaN layer. Zener breakdown of charge carriers needs to be generated by the tunnel junction layers 240 and 340 bonded to upper and lower portions of the common electrode layer 400. Accordingly, the common electrode may also be highly doped. When energy states of an n-type conduction band and a p-type valance band are at the same level or the p-type valance band is higher than the n-type conduction band to cause the Zener breakdown, electron tunneling is generated by reverse biasing. Thus, holes are modeled as being supplied from the n-type common electrode layer 400 to the active layers.

In particular, since the common electrode layer 400 is doped with n-type, the common electrode layer 400 has an excellent current spreading capability. Accordingly, the charge carriers are distributed evenly over the entire area of the active layers in which the light-emitting operation is performed, thereby leading to an increase in light-emitting efficiency.

Further, in the present inventive concept, the common electrode layer 400 may be doped n-type and may be doped at a high concentration. Doping at a high concentration means that the highly doped layer has a higher dopant concentration than the first n-type semiconductor layer 210. In addition, $n^{++}$ doping means having a higher dopant concentration than the first n-type semiconductor layer 210. In addition, $p^{++}$ doping means having a higher dopant concentration than the first p-type semiconductor layer 230 or the second p-type semiconductor layer 310. Hereinafter, the meaning of n$^{++}$ doping and the meaning of p$^{++}$ doping with respect to the doping level are equally applied.

Further, the layers formed on the growth substrate 101 may be formed through a known deposition method, for example, a metal-organic chemical vapor deposition (MOCVD) method, a hydride vapor phase epitaxy (HVPE) method, a molecular beam epitaxy (MBE) method, a plasma laser deposition (PLD) method, or a sputtering method, but the present inventive concept is not limited thereto.

A third current blocking layer 30 may be formed on the second sub-pixel 300. The third current blocking layer 30 may be formed of a p-type semiconductor or an insulating layer. P-type GaN or p-type AlGaN may be used as the p-type semiconductor, and Fe-doped GaN or SiO$_2$ may be used as the insulating layer.

In particular, when the third current blocking layer 30 is a SiO$_2$ material, a compound semiconductor may not be easily grown on the current blocking layer. Accordingly, when SiO$_2$ is used as a current blocking layer, a process of wafer-bonding of upper and lower sub-pixels with SiO$_2$ as the bonding agent may be used. In addition, when the third current blocking layer 30 is a p-type semiconductor or Fe-doped GaN, a compound semiconductor may be grown on the third current blocking layer 30.

The third sub-pixel 500 is formed on the third current blocking layer 30. The third sub-pixel 500 may include a third n-type semiconductor layer 510, a third active layer 520, and a third p-type semiconductor layer 530.

The third n-type semiconductor layer 510 may be formed on the third current blocking layer 30 and may be Si-doped GaN. In addition, the third n-type semiconductor layer 510 may be Si-doped AlInGaP. When the third n-type semiconductor layer 510 is an AlInGaP material, single-crystal compound semiconductor growth of the material below it cannot be accomplished. Accordingly, when the third sub-pixel 500 includes an AlInGaP material, a process of bonding the third sub-pixel 500 onto the third current blocking layer 30 may be used. In addition, when the third n-type semiconductor layer 510 is a GaN material, the third n-type semiconductor layer 510 is easily grown by using the third current blocking layer 30 as a base material for growth.

The third active layer 520 is formed on the third n-type semiconductor layer 510. The third active layer 520 forms light having the third wavelength longer than the second wavelength. For example, the third active layer 520 may form red light. The third active layer 520 may be formed based on the GaN material using a technique for controlling the fraction of In therein. When the third n-type semiconductor layer 510 is an AlInGaP material, the third active layer 520 may be formed using a technique for controlling the fraction of In.

The third p-type semiconductor layer 530 is formed on the third active layer 520. The third p-type semiconductor layer 530 supplies holes to the third active layer 520. To this end, the third p-type semiconductor layer 530 may be doped with Mg.

The common anode 600 is formed on the third p-type semiconductor layer 530, and the common anode 600 covers the third p-type semiconductor layer 530. In addition, the common anode 600 may be connected to the ground. The common anode 600 is made of a metallic material, and covers a side surface of the second sub-pixel 300 and the third sub-pixel 500. However, when the common anode 600 covers the side surfaces of the second sub-pixel 300 and the third sub-pixel 500, the common anode 600 may be electrically connected to the layers in the second sub-pixel 300 and the third sub-pixel 500, and thus an insulating layer 610 may be interposed between the common anode 600 and the side surfaces of the second sub-pixel 300 and the third sub-pixel 500.

In addition, the common anode 600 is also formed on a partially exposed surface of the common electrode layer 400. That is, the common anode 600 is electrically connected to the third p-type semiconductor layer 530 and the common electrode layer 400 which is commonly connected to the first sub-pixel 200 and the second sub-pixel 300. It is known in the art that an anode is formed on the entire surface of a p-type semiconductor layer or on a portion thereof. However, in the present inventive concept, in order to evenly supply a current to each of the sub-pixels and to supply a uniform current to each of the active layers, the common anode 600 is connected to the n-type common electrode layer 400 having a high conductivity. In addition, since the common anode 600 is formed over the entire third p-type semiconductor layer 530, the current may also be evenly supplied to the third p-type semiconductor layer 530. Accordingly, the phenomenon in which current is locally concentrated in an active layer is prevented.

A first interconnect layer 620 may be formed on an exposed portion of the second n-type contact layer 120 and an exposed portion of the second n-type semiconductor layer 330, and may electrically connect the second n-type contact layer 120 and the second n-type semiconductor layer 330 while covering side surfaces of the third n-type contact layer 130, the first sub-pixel 200, the common electrode layer 400, and the second sub-pixel 300. However, when the first interconnect layer 620 covers the side surfaces of the third n-type contact layer 130, the first sub-pixel 200, the common electrode layer 400, and the second sub-pixel 300, the first interconnect layer 620 may be electrically connected to other active layers, and thus the insulating layer 610 may be interposed therebetween. Accordingly, when a voltage for forming light of the second sub-pixel 300 is applied to the second n-type contact layer 120, the voltage may be transmitted to the second n-type semiconductor layer 330 of the second sub-pixel 300 through the first interconnect layer 620.

A second interconnect layer 630 may be formed on the third n-type semiconductor layer 510 and the first n-type contact layer 110 exposed through etching or the like, and the second interconnect layer 630 may be formed to extend from the third n-type semiconductor layer 510 to the first n-type contact layer 110. That is, the third n-type semiconductor layer 510 may be electrically connected to the first n-type contact layer 110 through the second interconnect layer 630. However, the extending portion of the second interconnect layer 630 may be electrically connected to other active layers and thus may be covered by the insulating layer 610. Accordingly, when a pulse of voltage for forming light of the third sub-pixel 500 is applied to the first n-type contact layer 110, the pulse of voltage may be transmitted to the third n-type semiconductor layer 510 of the third sub-pixel 500 through the second interconnect layer 630.

In the above-described structure, one common anode 600 as well as the first interconnect layer 620 and the second interconnect layer 630 are formed. That is, the first sub-pixel 200 and the second sub-pixel 300 are connected to the common anode 600 through the common electrode layer 400, and the third sub-pixel 500 is connected to the common anode 600 through the third p-type semiconductor layer 530. In addition, the first n-type semiconductor layer 210 of the first sub-pixel 200 is connected to the third n-type contact layer 130, the second n-type semiconductor layer 330 of the second sub-pixel 300 is connected to the second n-type contact layer 120 through the first interconnect layer 620, and the third n-type semiconductor layer 510 of the third sub-pixel 500 is connected to the first n-type contact layer 110 through the second interconnect layer 630. Accordingly, when a voltage difference is applied between the common anode 600 and the contact layers 110, 120, and 130, which are separately formed, each of the sub-pixels 200, 300, and 500 starts a light-emitting operation.

Light having a first wavelength corresponding to a first current flowing through the third n-type contact layer 130 is formed in the first active layer 220, and light having a second wavelength corresponding to a second current flowing through the second n-type contact layer 120 and longer than the first wavelength is formed in the second active layer 320. The first current and the second current flowing through the second n-type contact layer 120 and the third n-type contact layer 130 are prevented from interfering with each other by the first current blocking layer 10.

In addition, light having a third wavelength longer than the second wavelength is formed in the third active layer 520 to correspond to a third current flowing through the first n-type contact layer 110. The second current and the third current flowing through the first n-type contact layer 110 and the second n-type contact layer 120 are prevented from interfering with each other by the second current blocking layer 20. That is, the first current, the second current, and the third current may act independently of each other due to the first current blocking layer 10 and the second current blocking layer 20.

The formed light of the first wavelength, the formed light of the second wavelength, and the formed light of the third wavelength may be directed toward the growth substrate 101 and may be directed away from the growth substrate 101. However, the light traveling in the direction away from the growth substrate 101 is reflected by the common anode 600 formed on the entire surface of the third p-type semiconductor layer 530 and is directed toward the growth substrate 101. Accordingly, the three types of formed light are emitted toward the growth substrate 101. Thus, a specific color is realized.

Figure 2:
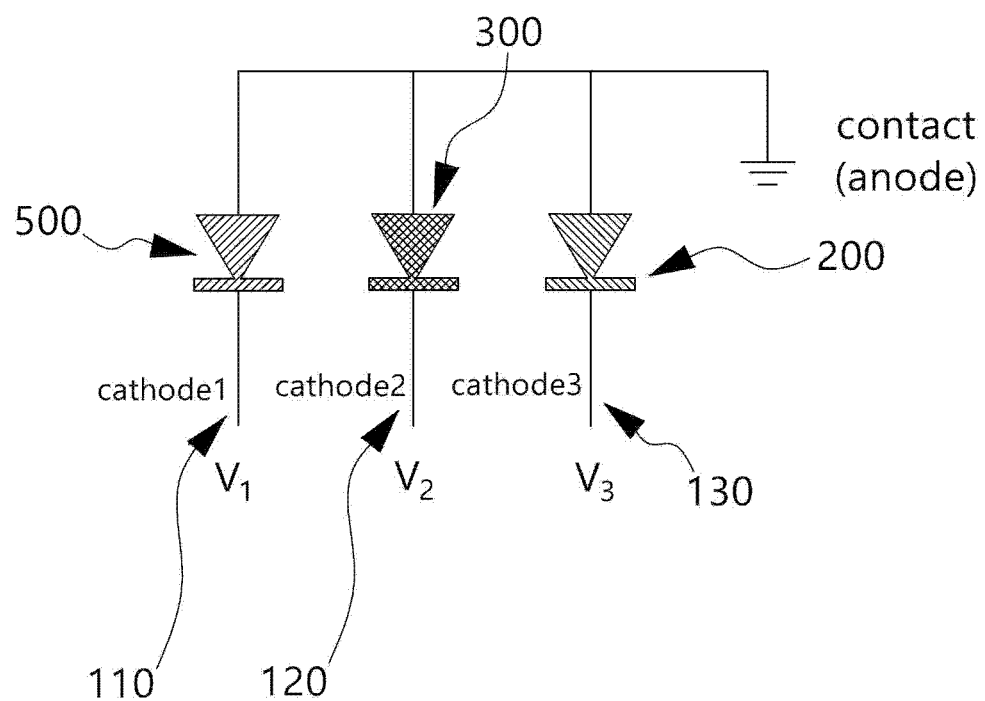
FIG. 2 is a circuit diagram schematically illustrating an equivalent circuit of the pixel of the microdisplay illustrated in FIG. 1.

FIG. 2 is a circuit diagram schematically illustrating an equivalent circuit of the pixel of the micro display illustrated in FIG. 1.

Figure 3:
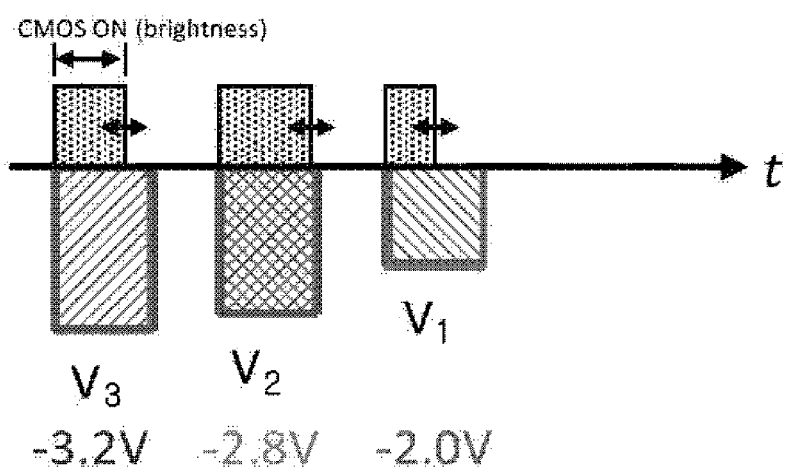
FIG. 3 is a diagram illustrating an applied signal applied to the pixel of the microdisplay illustrated in FIG. 1.

FIG. 3 is a diagram illustrating a signal applied to the pixel of the micro display illustrated in FIG. 1.

Referring to FIGS. 2 and 3, the first sub-pixel 200, the second sub-pixel 300, and the third sub-pixel 500 are connected to the common anode 600 connected to the ground, and the sub-pixels 200, 300, and 500 are respectively forward biased from the common anode 600 to the third n-type contact layer 130, the second n-type contact layer 120, and the first n-type contact layer 110 which are independent. Thus, an applied pulse may be either a positive or negative pulse, and a darker color may have a longer pulse or pulsed multiple times to increase brightness. In addition, each sub-pixel may have the same single voltage.

Second Example Embodiment

Figure 4:
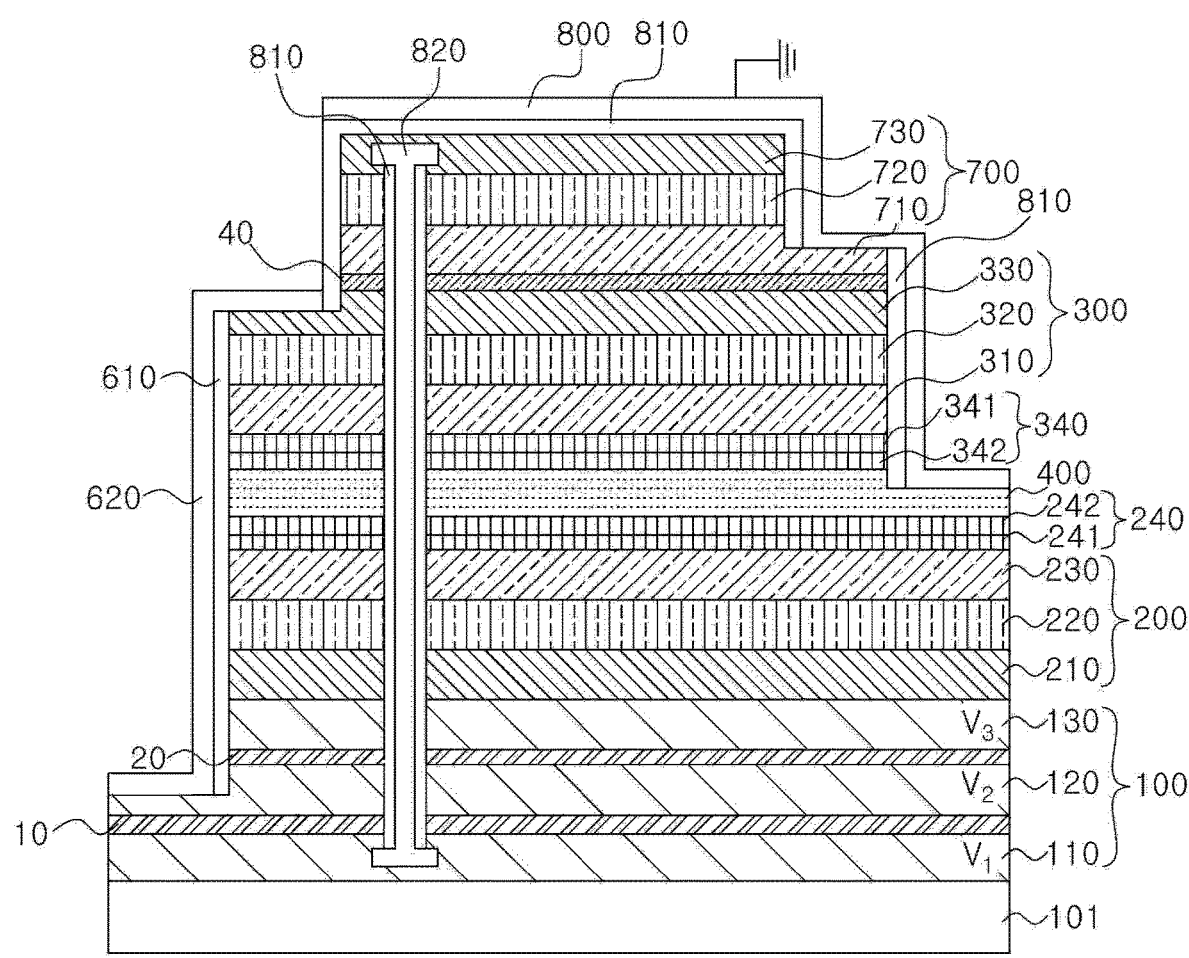
FIG. 4 is a schematic cross-sectional view of a pixel of a microdisplay according to a second example embodiment of the present inventive concept.

FIG. 4 is a schematic cross-sectional view of a pixel of a micro display according to a second example embodiment of the present inventive concept.

Referring to FIG. 4, a contact layer 100, a first sub-pixel 200, a second sub-pixel 300, a common electrode layer 400, and a third sub-pixel 700 are formed on a growth substrate 101. The contact layer 100, the first sub-pixel 200, the second sub-pixel 300, and the common electrode layer 400 are the same as described above with reference to FIG. 1. However, the arrangement and configuration of the third sub-pixel 700 are different from FIG. 1. Accordingly, the third sub-pixel 700 will be mainly described.

In the third sub-pixel 700, a third p-type semiconductor layer 710, a third active layer 720, and a third n-type semiconductor layer 730 are sequentially disposed. In addition, a bonding layer 40 is formed on the second sub-pixel 300, and the third sub-pixel 700 is disposed on the bonding layer 40. The third sub-pixel 700 is grown on a separate substrate other than the growth substrate 101 on which the first sub-pixel 200 and the second sub-pixel 300 are formed. For example, the third sub-pixel 700 is formed on a GaAs substrate and is bonded to the second sub-pixel 300 through the bonding layer 40. In addition, the GaAs substrate used for growth of the third sub-pixel 700 may be easily removed by an acid solution or the like. As for a material of the bonding layer 40, any transparent material is appropriate, but a polymer material having an adhesive property is preferable.

The third p-type semiconductor layer 710 is made of an AlInGaP material and Mg is used as a dopant. In addition, it is preferable that the active layer is made of an AlInGaP material and have a quantum well structure by controlling the fraction of In. The third n-type semiconductor layer 730 is also made of an AlInGaP material and Si is used as a dopant.

A common anode 800 is formed on the third n-type semiconductor layer 730, and the common anode 800 covers the third n-type semiconductor layer 730. In addition, the common anode 800 may be connected to the ground. However, an insulating layer 810 is interposed between the common anode 800 and the third n-type semiconductor layer 730. The common anode 800 is made of a metallic material, and covers side surfaces of the second sub-pixel 300 and the third sub-pixel 700. However, the insulating layer 810 is interposed between the common anode 800 and the side surfaces of the second sub-pixel 300 and the third sub-pixel 700 to prevent the common anode 800 from being connected to the side surfaces of other active layers.

Further, the common anode 800 is also formed on a partially exposed surface of each of the third p-type semiconductor layer 710 and the common electrode layer 400. That is, the common anode 800 is electrically connected to the third p-type semiconductor layer 710 and the common electrode layer 400 which is commonly connected to the first sub-pixel 200 and the second sub-pixel 300.

A first interconnect layer 620 is the same as described above with reference to FIG. 1. However, a second interconnect layer 820 may be formed on the third n-type semiconductor layer 730 and a first n-type contact layer 110 exposed through etching or the like, and may be formed to extend beyond the third active layer 720 and the third p-type semiconductor layer 710 to the first n-type contact layer 110. In addition, the extending portion of the second interconnect layer 820 may be electrically connected to other active layers and thus may be covered by the insulating layer 810.

Also, in the structure according to the second example embodiment, one common anode 800 as well as the first interconnect layer 620 and the second interconnect layer 820 are formed. That is, the first sub-pixel 200 and the second sub-pixel 300 are connected to the common anode 800 through the common electrode layer 400, and the third sub-pixel 700 is connected to the common anode 800 through the third p-type semiconductor layer 710. In addition, a first n-type semiconductor layer 210 of the first sub-pixel 200 is connected to a third n-type contact layer 130, a second n-type semiconductor layer 330 of the second sub-pixel 300 is connected to a second n-type contact layer 120 through the first interconnect layer 620, and the third n-type semiconductor layer 730 of the third sub-pixel 700 is connected to a first n-type contact layer 110 through the second interconnect layer 820. Accordingly, when a voltage difference is applied between the common electrode and the contact layers which are separately formed, each of the sub-pixels starts a light-emitting operation.

As described above, in the present example embodiment, three sub-pixels forming different wavelengths are stacked in a direction perpendicular to the growth substrate. In addition, one common anode is formed in the sub-pixels, and currents are applied through contact layers formed below the sub-pixels. Each of the sub-pixels performs a light-emitting operation based on the currents, each of which is supplied independently of another, and light formed in each of the sub-pixels is mixed to form a specific color.

In the present inventive concept, sub-pixels, which form light having different wavelengths, are vertically formed on a growth substrate. Thus, the area of a unit pixel of a microdisplay may be reduced. That is, the area of the unit pixel may be significantly reduced, compared to a conventional method in which red, green, and blue sub-pixels that are horizontally disposed on a display substrate are combined to form the unit pixel.

Further, when sub-pixels are arranged horizontally in the same plane, a pick-and-place process is essential to manufacture a microdisplay. This process is referred to by those skilled in the art as a transfer process. The transfer process refers to a process in which sub-pixels formed on the growth substrate 101 are disposed on a display substrate. When the conventional technique is performed, transfer of a red sub-pixel, transfer of a green sub-pixel, and transfer of a blue sub-pixel should be performed separately. That is, at least three transfer processes are required. However, in the present inventive concept, since three vertically stacked sub-pixels constitute the unit pixel, the unit pixel may be implemented by performing vertical stacking on a single wafer without going through a transfer process. In addition, as compared with the case in which the sub-pixels are disposed horizontally, in the present inventive concept, the sub-pixels are disposed vertically, and thus colors may be mixed more effectively.

Furthermore, manufacturing may be facilitated and the area of a unit pixel may be reduced by forming a plurality of n-type contact layers on a growth substrate which are individually connected to sub-pixels which are vertically formed on the plurality of n-type contact layers. The sub-pixels may be individually and independently controlled by forming a current blocking layer between each of the plurality of n-type contact layers.

According to the present inventive concept described above, sub-pixels which form light having different wavelengths are vertically formed on a growth substrate. Thus, the area of a unit pixel of a microdisplay can be reduced. That is, the area of the unit pixel can be significantly reduced as compared to a conventional method in which red, green, and blue sub-pixels are horizontally disposed on a display substrate and combined to form a unit pixel.

Further, since the disadvantages of the conventional method in which multiple pixels of a backplane must be used per unit pixel of a display when sub-pixels are disposed in the same plane can be overcome, high resolution can be realized.

Further, manufacturing can be facilitated and the area of a unit pixel can be reduced by forming a plurality of n-type contact layers on a growth substrate which are individually connected to sub-pixels which are vertically formed on the plurality of n-type contact layers.

Further, sub-pixels can be individually and independently controlled by forming a current blocking layer between each of a plurality of n-type contact layers.

It should be noted that technical implementations of the present inventive concept are not limited to those described above, and other technical implementations of the present inventive concept will be apparent to those skilled in the art from the following descriptions.

Meanwhile, the example embodiments of the present inventive concept disclosed in the present specification and the drawings are only illustrative of specific examples for the purpose of understanding and are not intended to limit the scope of the present inventive concept. It will be apparent to those skilled in the art that other modifications based on the technical spirit of the present inventive concept are possible in addition to the example embodiments disclosed herein.

DESCRIPTION OF REFERENCE NUMERALS

10: first current blocking layer, 20: second current blocking layer
30: third current blocking layer, 40: bonding layer
100: contact layer, 101: growth substrate
110: first n-type contact layer, 120: second n-type contact layer
130: third n-type contact layer, 200: first sub-pixel
210: first n-type semiconductor layer, 220: first active layer
230: first p-type semiconductor layer, 240: first tunnel junction layer
241 and 341: $p^{++}$-GaN layers, 242 and 342: $n^{++}$-GaN layers
300: second sub-pixel, 310: second p-type semiconductor layer
320: second active layer, 330: second n-type semiconductor layer
340: second tunnel junction layer, 400: common electrode layer
500 and 700: third sub-pixels, 510 and 730: third n-type semiconductor layers
520 and 720: third active layers, 530 and 710: third p-type semiconductor layers
600 and 800: common anodes, 610 and 810: insulating layers
620: first interconnect layer, 630 and 820: second interconnect layers

What is claimed is:

1. A unit pixel of a microdisplay, comprising:
a first sub-pixel formed on a growth substrate;
a second sub-pixel formed on the first sub-pixel;
a common electrode layer formed between the first sub-pixel and the second sub-pixel;
a third sub-pixel formed on the second sub-pixel; and
a contact layer formed between the growth substrate and the first sub-pixel, and independently connected to each of the first sub-pixel, the second sub-pixel, and the third sub-pixel;
wherein the contact layer includes:
a first n-type contact layer formed on the growth substrate and connected to the third sub-pixel;

a second n-type contact layer formed on the first n-type contact layer and connected to the second sub-pixel;

a third n-type contact layer formed on the second n-type contact layer and connected to the first sub-pixel;

a first current blocking layer formed between the first n-type contact layer and the second n-type contact layer; and a second current blocking layer formed between the second n-type contact layer and the third n-type contact layer.

2. The unit pixel of claim 1, wherein the first current blocking layer and the second current blocking layer are each a p-type semiconductor or an insulating material.

3. The unit pixel of claim 1, further comprising:
a first tunnel junction layer formed between the common electrode layer and the first sub-pixel; and
a second tunnel junction layer formed between the common electrode layer and the second sub-pixel.

4. The unit pixel of claim 1, wherein
the first sub-pixel includes a first n-type semiconductor layer, a first active layer, and a first p-type semiconductor layer which are sequentially stacked,
the second sub-pixel includes a second p-type semiconductor layer, a second active layer, and a second n-type semiconductor layer which are sequentially stacked, and
the third sub-pixel includes a third n-type semiconductor layer, a third active layer, and a third p-type semiconductor layer which are sequentially stacked.

5. The unit pixel of claim 4, further comprising a third current blocking layer formed between the second sub-pixel and the third sub-pixel.

6. The unit pixel of claim 5, wherein the third current blocking layer is a p-type semiconductor or an insulating material.

7. The unit pixel of claim 4, further comprising:
a first interconnect layer configured to electrically connect the second n-type semiconductor layer and the second n-type contact layer;
a second interconnect layer configured to electrically connect the third n-type semiconductor layer and the first n-type contact layer; and
a common anode formed on an exposed surface of the common electrode layer and covering the third p-type semiconductor layer.

8. The unit pixel of claim 7, wherein
the first interconnect layer is formed on an exposed portion of each of the second n-type semiconductor layer and the second n-type contact layer, and
the second interconnect layer is formed on an exposed portion of each of the third n-type semiconductor layer and the first n-type contact layer to extend from the third n-type semiconductor layer to the first n-type contact layer.

9. The unit pixel of claim 1, wherein
the first sub-pixel includes a first n-type semiconductor layer, a first active layer, and a first p-type semiconductor layer which are sequentially stacked,
the second sub-pixel includes a second p-type semiconductor layer, a second active layer, and a second n-type semiconductor layer which are sequentially stacked, and
the third sub-pixel includes a third p-type semiconductor layer, a third active layer, and a third n-type semiconductor layer which are sequentially stacked.

10. The unit pixel of claim 9, further comprising a bonding layer formed between the second sub-pixel and the third sub-pixel.

11. The unit pixel of claim 9, further comprising:
a first interconnect layer configured to electrically connect the second n-type semiconductor layer and the second n-type contact layer;
a second interconnect layer configured to electrically connect the third n-type semiconductor layer and the first n-type contact layer; and
a common anode formed on the common electrode layer and the third p-type semiconductor layer and covering the third n-type semiconductor layer,
wherein the common anode is formed to be insulated from the third n-type semiconductor layer.

12. The unit pixel of claim 11, wherein
the first interconnect layer is formed on an exposed portion of each of the second n-type semiconductor layer and the second n-type contact layer, and
the second interconnect layer is formed on an exposed portion of each of the third n-type semiconductor layer and the first n-type contact layer to extend from the third n-type semiconductor layer to the first n-type contact layer.

13. The unit pixel of claim 9, wherein the third active layer includes AlInGaP.

* * * * *